United States Patent [19]

Satou

[11] Patent Number: 4,542,379
[45] Date of Patent: Sep. 17, 1985

[54] CIRCUIT FOR DRIVING A DISPLAY DEVICE

[75] Inventor: Kouichirou Satou, Kawasaki, Japan

[73] Assignee: Tokyo Shibaura Denki Kabushiki Kaisha, Japan

[21] Appl. No.: 462,697

[22] Filed: Jan. 31, 1983

Related U.S. Application Data

[63] Continuation of Ser. No. 211,402, Nov. 28, 1980.

[30] Foreign Application Priority Data

Nov. 29, 1979 [JP] Japan ................. 54-153605

[51] Int. Cl.[4] ................................. G09F 9/00
[52] U.S. Cl. .................. 340/758; 340/762; 340/765; 340/803
[58] Field of Search ........... 307/471; 340/803, 811, 340/758, 762, 765

[56] References Cited

U.S. PATENT DOCUMENTS

| | | | |
|---|---|---|---|
| 3,781,865 | 12/1973 | Yamazaki | 340/765 |
| 3,815,120 | 6/1974 | Kanda | 340/758 |
| 3,925,690 | 12/1975 | Spence | 340/762 X |
| 4,040,721 | 8/1977 | Kurita | 350/160 LC |
| 4,050,064 | 9/1977 | Hashimoto et al. | 340/765 |
| 4,149,149 | 4/1979 | Miki et al. | 340/803 X |
| 4,178,593 | 12/1979 | Kishino et al. | 340/753 |
| 4,205,311 | 5/1980 | Kutaragi | 340/765 X |

FOREIGN PATENT DOCUMENTS

| | | |
|---|---|---|
| 2733529 | 2/1978 | Fed. Rep. of Germany . |
| 1329325 | 9/1973 | United Kingdom . |
| 1398237 | 6/1975 | United Kingdom . |
| 1426896 | 3/1976 | United Kingdom . |
| 1447640 | 8/1976 | United Kingdom . |
| 1514857 | 6/1978 | United Kingdom . |
| 1565364 | 4/1980 | United Kingdom . |

Primary Examiner—David L. Trafton
Attorney, Agent, or Firm—Finnegan, Henderson, Farabow, Garrett & Dunner

[57] ABSTRACT

A drive circuit for a display device comprises a first input terminal adapted to be connected to receive a drive signal for driving a display device, a second input terminal adapted to be connected to receive a control signal for controlling the driving of the display device, an exclusive OR gate connected to receive the drive signal and the control signals supplied to the input terminals, and an MOS transistor which is turned on and off according to the output level of the OR gate.

24 Claims, 23 Drawing Figures

F I G. 10
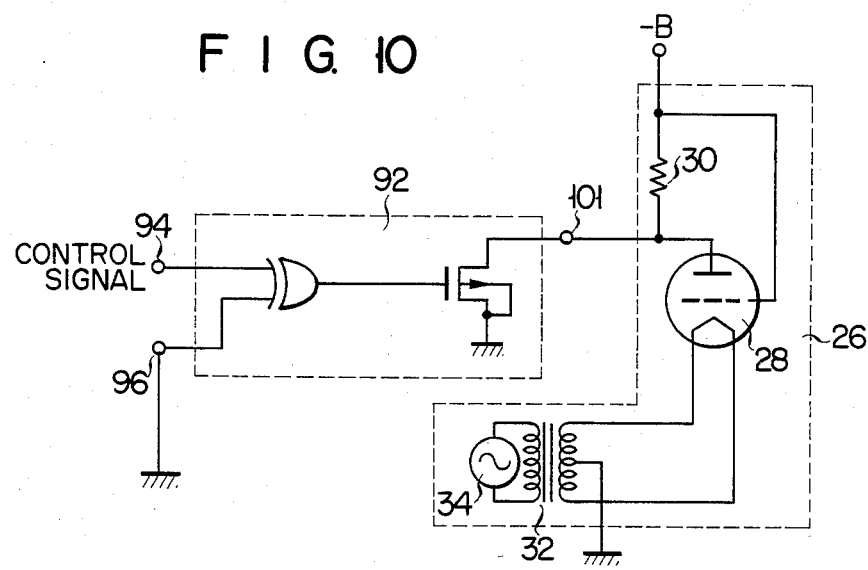
F I G. 11
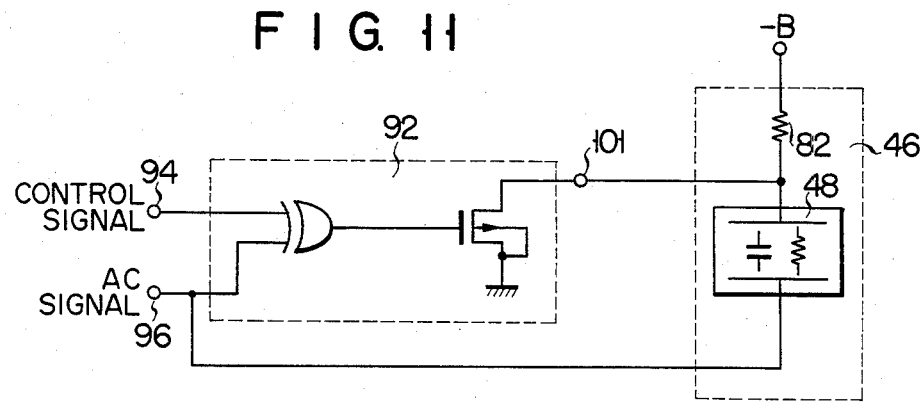
F I G. 12
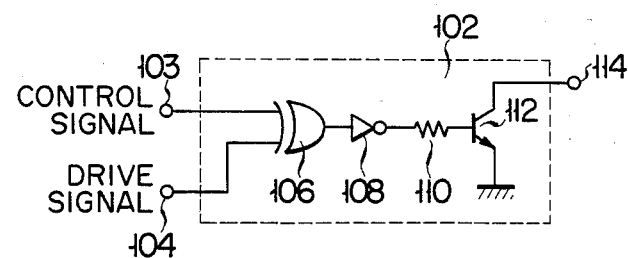

F I G. 18
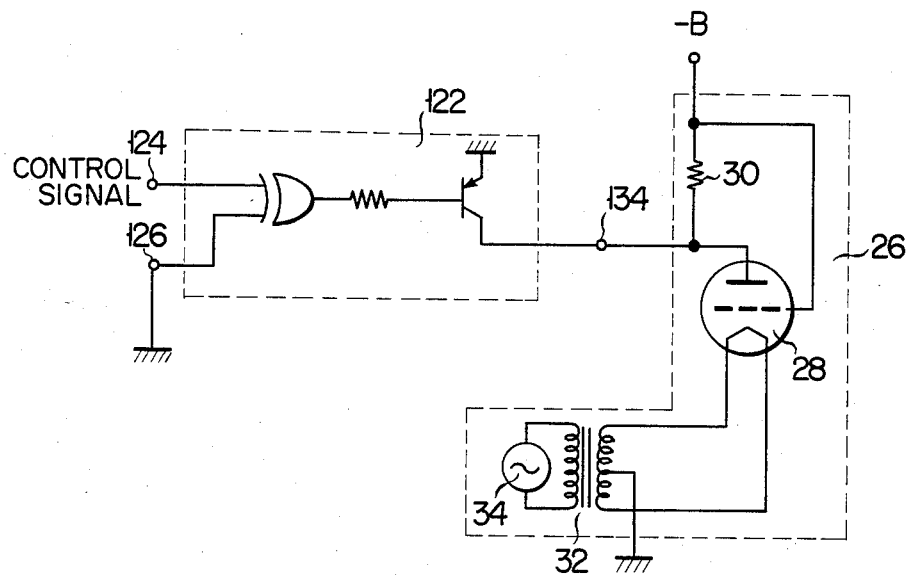
F I G. 19
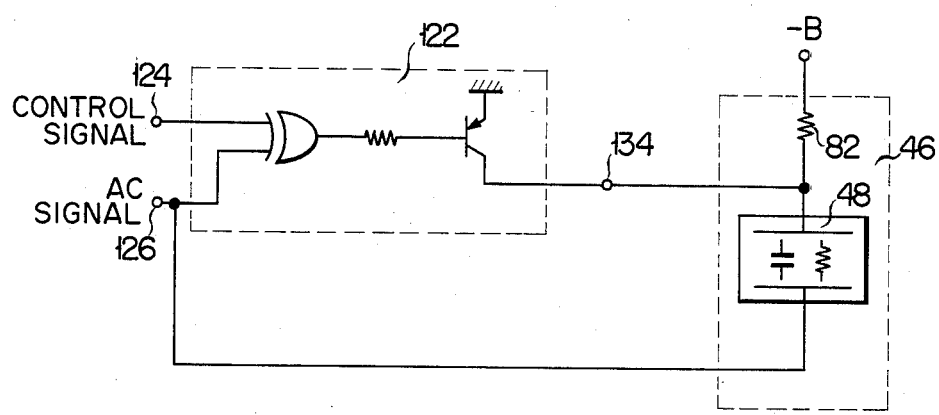

CIRCUIT FOR DRIVING A DISPLAY DEVICE

This is a continuation of application Ser. No. 211,402 filed Nov. 28, 1980.

This invention relates to a circuit which can drive display devices of different structures each comprising display elements of a specific type.

Light emitting diodes (LEDs), fluorescent lamps (FLs) and liquid crystal devices (LCDs) have been used in great numbers to provide an LED display device, an FL display device and an LCD display device. These display elements are driven in different methods. More specifically, LEDs are driven by current signal, and FLs are driven by voltage signal. And LCDs are driven by AC signals so that they may function for a longer time.

LEDs and LCDs can be driven by a low voltage of a few volts, whereas FLs cannot be driven unless applied with a high voltage of ten or more volts. That is, display elements of different types are driven by different voltages. Various drive circuits have therefore been manufactured, each of which is desired for a display device comprising display elements of a specific type.

FIG. 1 shows a known driven circuit 12 so designed as to drive an LED display device, i.e. display device comprising LEDs. The drive circuit 12 comprises an N channel MOS transistor 14 and is used to drive an LED display device 18 having an LED 16. When its gate receives a signal of a high level, the MOS transistor 14 is turned on, whereby current flows to the LED 16 through a resistor 20 to cause the LED 16 emit light.

FIG. 2 shows a known drive circuit 22 so designed as to drive an FL display device, i.e. display device comprising FLs. The drive circuit 22 comprises an N channel MOS transistor 24 and is used to drive an FL display device 26 which has an FL 28. As long as its gate receives a signal of a low level, the MOS transistor 24 is turned off, whereby the plate of the FL 28 has a high potential level and thus emits light. The FL 28 does not emits light if applied with a low voltage. To make the FL 28 emit light it is therefore necessary to apply a considerably high voltage to the FL 28. The positive potential +B of the FL display device 26 is thus relatively high, e.g. +15 V.

FIG. 3 shows a known drive circuit 42 so designed as to drive an LCD display device, i.e. display device comprising LCDs. The drive circuit 42 comprises an exclusive OR gate 44 and is used to drive an LCD display device 46 which has an LCD 48. The two input terminals 50 and 52 of the OR gate 44 are supplied with a control signal and an AC signal, respectively. The control signal has selectively a high level, and the AC signal has alternately a high level and a low level. When the input terminals 50 and 52 receive respectively a control signal of a high level and an AC signal of a high level, the output level of the drive circuit 42 is low, thus providing a potential difference across the LCD 48 and subsequently enabling the LCD 48.

As mentioned above, LEDs are driven by a current signal in a specific method, FLs by a voltage signal in another method, and LCDs by an AC signal in still another method. The LED display device, the FL display device and the LCD display device therefore need drive circuits which are designed specially for them.

Accordingly it is an object of this invention to provide a drive circuit which can be used in common for display devices of different structures each comprising display elements of a specific type.

The invention provides a circuit for driving display devices of different structures, which comprises a first input terminal adapted to be connected to receive a drive signal for driving a display device, a second input terminal adapted to be connected to receive a pulsative control signal for controlling the driving of the display device, a logic gate for providing an exclusive OR of the drive signal and the control signal, and a switching element which is opened and closed according to the output level of the logic gate.

This invention can be more fully understood from the following detailed description when taken in conjunction with the accompanying drawings, in which:

FIG. 10 shows how the drive circuit of FIG. 8 drives an FL display device;

FIG. 11 illustrates how the drive circuit of FIG. 8 drives an LCD display device;

FIG. 12 is a circuit diagram of another drive circuit embodying this invention;

FIG. 18 shows how the drive circuit of FIG. 16 drives an FL display device;

FIG. 19 shows how the drive circuit of FIG. 16 drives an LCD display device;

Figure 1:
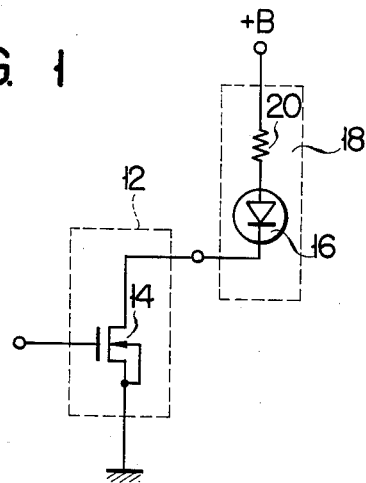
FIG. 1 is a circuit diagram of a prior art drive circuit for driving an LED display device.
Figure 2:
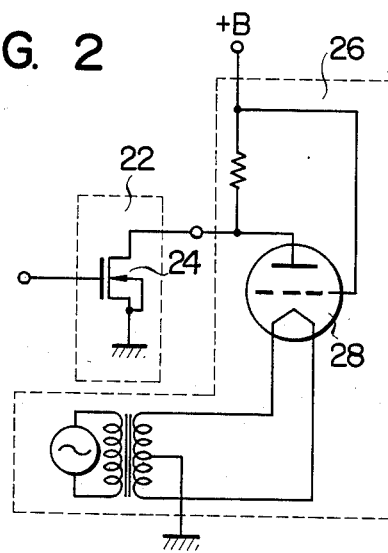
FIG. 2 is a circuit diagram of a prior art drive circuit for driving an FL display device.
Figure 3:
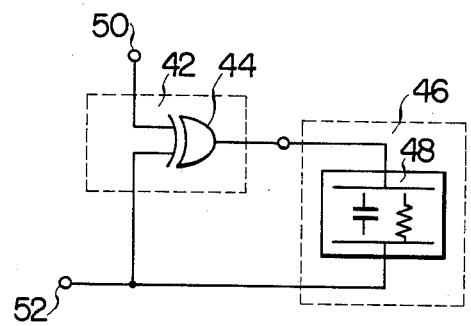
FIG. 3 is a circuit diagram of a prior art drive circuit for driving an LCD display device.
Figure 4:
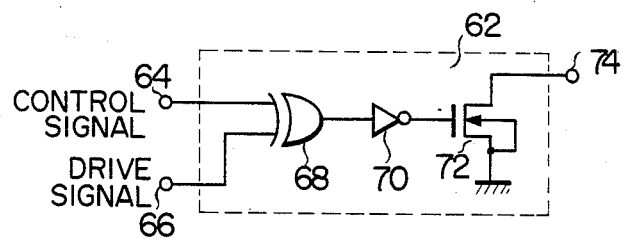
FIG. 4 is a circuit diagram of a drive circuit embodying this invention.

FIG. 4 shows a drive circuit 62 embodying this invention. The circuit 62 comprises an exclusive OR gate 68 having two input terminals 64 and 66, an inverter 70 connected to the output of the EXCLUSIVE OR gate 68, and an N channel type MOS (metal oxide semiconductor) transistor 72 connected to the output of the inverter 70.

The source of the MOS transistor 72 is connected to the substrate. The input terminals 64 and 66 of the OR gate 68 work as input terminals of the drive circuit 62. The drain of the MOS transistor 72 functions as an output terminal 74 of the drive circuit 72.

The input terminal 64 of the OR gate 68 is adapted to be connected to receive a pulsing control signal for controlling the driving of a display device which is to be connected to the drive circuit 62. The input terminal 66 of the OR gate 68 is adapted to be connected to receive a drive signal for driving the display device. Hereinafter the input terminals 64 and 66 will be called "control terminal" and "drive terminal", respectively. The OR gate 68 provides an exclusive OR of the drive signal and the control signal.

When the control signal and the drive signal supplied respectively to the control terminal 64 and the drive terminal 66 have a low level, the output of the OR gate 68 has a low level, too. The output of the inverter 70 therefore has a high level and turns on the MOS transistor 72. Consequently, the output terminal 74 of the MOS transistor 72 is put at a low level.

When the input signals of the EXCLUSIVE OR gate 68 have different levels, the output of gate 68 has a high level. The output of the inverter 70 therefore has a low level and turns off the MOS transistor 72. Consequently, the output terminal 74 of the MOS transistor 72 is put at a high level.

Now it will be described how the drive circuit 62 shown in FIG. 4 may be employed to drive display devices of various structures.

Figure 5:
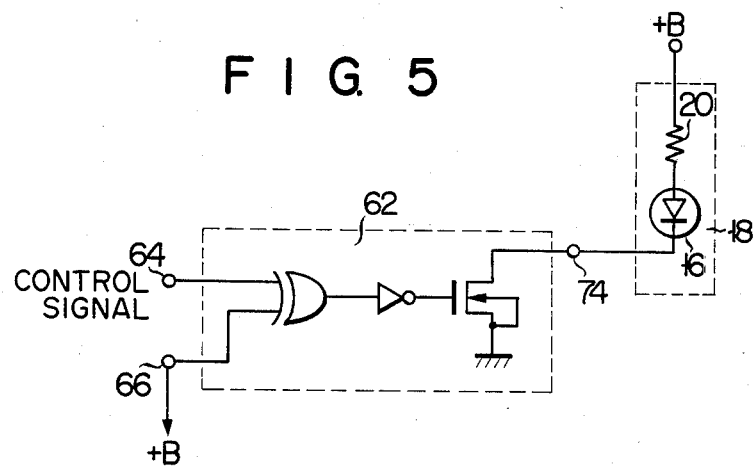
FIG. 5 shows how the drive circuit of FIG. 4 drives an LED display device.

FIG. 5 illustrates how the drive circuit 62 drives an LED display device. As shown in FIG. 5, the output terminal 74 of the circuit 62 is connected to the cathode of an LED 16 of an LED display device 18. The anode of the LED 16 is connected to a positive potential +B via a resistor 20. The drive terminal 66 of the circuit 62 is connected also to a positive potential +B. The terminal 66 therefore receives a drive signal of potential +B. The control terminal 64 of the drive circuit 62 may receive a control signal which will control the driving of LED 16, that is, light-emission of the LED 16. When a pulse of a high level is supplied to the control terminal 64, the MOS transistor 72 is turned on and subsequently supplies current to the LED 16 through the resistor 20, whereby the LED 16 emits light. On the other hand, when a pulse of a low level is supplied to the control terminal 64, the MOS transistor 72 is turned off and supplies no current to the LED 16 through the resistor 20, whereby the LED 16 does not emit light.

Figure 6:
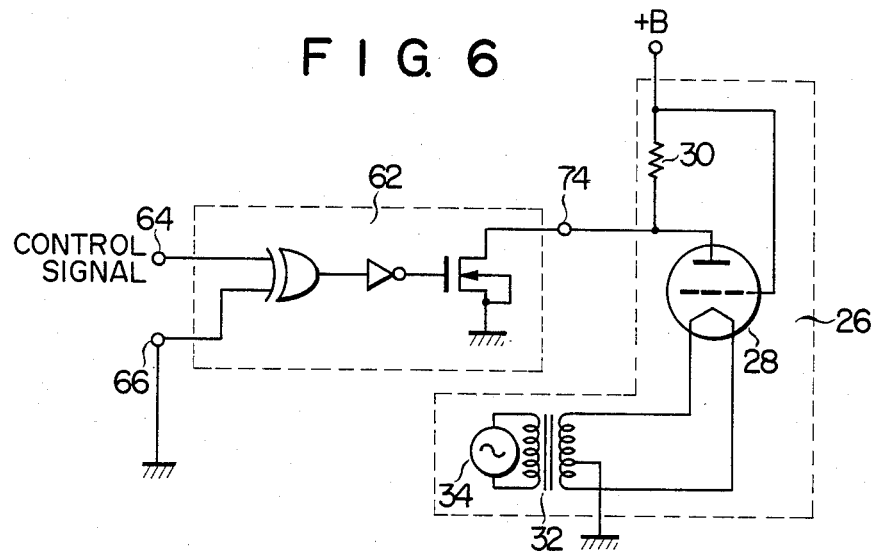
FIG. 6 shows how the drive circuit of FIG. 4 drives an FL display device.

FIG. 6 shows how the drive circuit 62 of FIG. 4 drives an FL display device. As shown in FIG. 6, the output terminal 74 of the circuit 62 is connected to a positive potential +B via a resistor 30 of an FL display device 26 and also to the plate of an FL 28 of the device 26. The drive terminal 66 is connected to the ground. Therefore, a drive signal of ground level is supplied to the drive terminal 66. The grid of the FL 28 is connected to the positive potential +B. The filament of the FL 28 is connected to the positive potential +B. The filament of the FL 28 is connected through an transformer 32 to an AC power source 34. The control terminal 64 of the drive circuit 62 is connected to receive a pulse or a control signal for controlling the FL 28. When the control signal supplied to the terminal 64 has a high level, the MOS transistor 72 is turned off and the output terminal 74 is put at a high level. In this case a potential difference is provided between the plate and cathode of the FL 28, whereby the FL 28 emits light.

Figure 7:
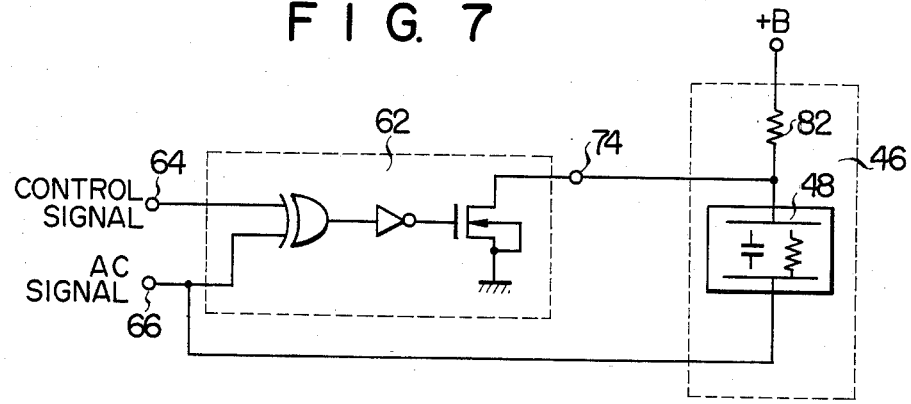
FIG. 7 illustrates how the drive circuit of FIG. 4 drives an LCD display device.

FIG. 7 shows how the drive circuit 62 of FIG. 4 drives an LCD display device. As illustrated in FIG. 7, the output terminal 74 of the circuit 62 is connected to a positive potential +B through a resistor 82 of an LCD display device 46 and also to one terminal of an LCD 48 of the device 46. The drive terminal 66 of the circuit 62 is connected to receive an AC signal which has alternately a high level and a low level, or a pulsing signal to use a term of a broader sense. This signal is supplied also to the other terminal of LCD 48. The control terminal 64 of the drive circuit 62 is connected to receive a control signal, or a pulse of a high level or a pulse of a low level, which will control the driving of the LCD 48. When the control signal supplied to the control terminal 64 has a high level, the LCD 48 is enabled.

More specifically, when both the control signal and the AC signal have a high level, the output terminal 74 of the drive circuit 62 is placed at a low level, whereby a potential difference is provided across the LCD 48 and the LCD 48 is thus enabled. Said potential difference is identical with the difference between the potential of the control signal and the potential of the AC signal. When the control signal has a high level and the AC signal has a low level, the output terminal 74 is put at a high level, i.e. potential +B, whereby a potential difference is provided across the LCD 48 and the LCD 48 is enabled. On the other hand, when the control signal has a low level, both terminals of the LCD 48 are applied with the same potential no matter whether the AC signal has a high or low level, whereby the LCD 48 is disabled. Thus, the LCD 48 is enabled when the control signal has a high level and is disabled when the control signal has a low level, no matter whether the AC signal has a high or low level.

As evident from the above, the drive circuit of this invention can be used to drive an LED display device, an FL display device and an LCD display device. The drive circuit drives a display device when supplied with a drive signal of either a low or high level and a control signal of a high level.

Figure 8:
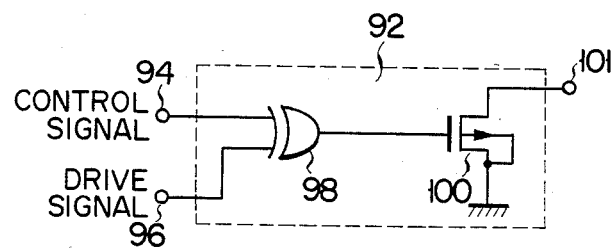
FIG. 8 is a circuit diagram of another drive circuit embodying the invention.

The N channel type MOS transistor 72 of the drive circuit 62 shown in FIG. 4 may be replaced by a P channel type MOS transistor as illustrated in FIG. 8. Provided with a P channel type MOS transistor 100, a drive circuit 92 of FIG. 8 need not be provided with an inverter, unlike the circuit 62 of FIG. 4. The drive circuit 92 comprises, in addition to the MOS transistor 100, an exclusive OR gate 98 which has a control terminal 94 and a drive terminal 96 and the output of which is connected to the MOS transistor 100. The source of the MOS transistor 100 is connected to the substrate. The drain of the MOS transistor 100 works as an output terminal 101 of the drive circuit 92.

When a control signal and a drive signal, both having a high level or a low level, are supplied respectively to the terminals 94 and 96, the output level of the OR gate 98 becomes low. As a result, the MOS transistor 100 is turned on, and the output terminal 101 is placed on a low level. By contrast, when at least one of the input signals supplied to the drive circuit 92 has a low level, the output level of the OR gate 89 becomes high. As a result, the MOS transistor 100 is turned off, whereby the output terminal 101 is placed at a high level.

Figure 9:
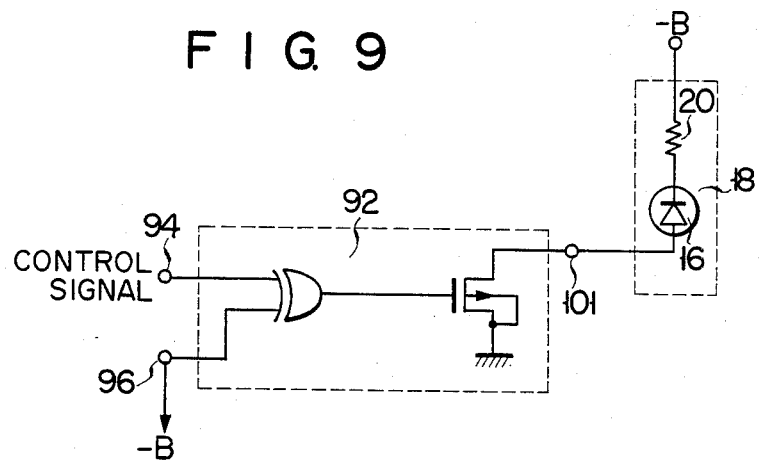
FIG. 9 shows how the drive circuit of FIG. 8 drives an LED display device.

FIGS. 9, 10 and 11 illustrate how the drive circuit 92 of FIG. 8 drives an LED display device, an FL display device and an LCD display device which are identical in structure with those shown in FIGS. 5, 6 and 7. The drive circuit 92 operates in the same way as does the drive circuit 62 shown in FIG. 4, except that the polarity of every voltage applied to the drive terminal 96 and the display device has a polarity opposite to that of the voltage applied to the drive terminal 66 and the display device both shown in FIGS. 5, 6 and 7. This is because the drive circuit 92 is provided with a P channel type MOS transistor, not an N channel type transistor.

If drive circuit 92 is used to drive an LED display device 18 as shown in FIG. 9 or to drive an FL display device 26 as shown in FIG. 10, the output terminal 101 is placed at a low level, thus enabling an LED 16 of the device 18 or an FL 28 of the device 26, when the control signal supplied to the control terminal 94 has a low level. If the drive circuit 92 is used to drive an LCD display device 46 as shown in FIG. 11, an LCD 48 of the device 46 is enabled when, as in the case of FIG. 7, the control signal applied to the control terminal 94 has a high level to provide a potential difference between the terminals of the LCD 48.

As shown in FIG. 9, the anode and cathode of the LED 16 of the LED display device 18 take positions opposite to those of the anode and cathode of the LED display device shown in FIG. 5.

According to this invention, the MOS transistor used in the above-described embodiments may be replaced by a bipolar transistor, for example an NPN transistor as illustrated in FIG. 12. A drive circuit 102 shown in FIG. 12 comprises an exclusive OR gate 106 having a control terminal 103 and a drive terminal 104, an inverter 108 connected to the output of the OR gate 106, a resistor 110 connected to the output of the inverter 108 and an NPN transistor 112 having its gate connected to the resistor 110. The resistor 110 limits a current flowing therethrough. When a control signal and a drive signal, both being of a high level or a low level, are applied respectively to the control terminal 103 and the drive terminal 104, the NPN transistor 112 is turned on, whereby the collector of the transistor 112, i.e. an output terminal 114 of the circuit 102, is placed at a low level. The drive circuit 102 corresponds to the drive circuit 62 of FIG. 4 as far as the polarity of voltage applied is concerned.

Figure 13:
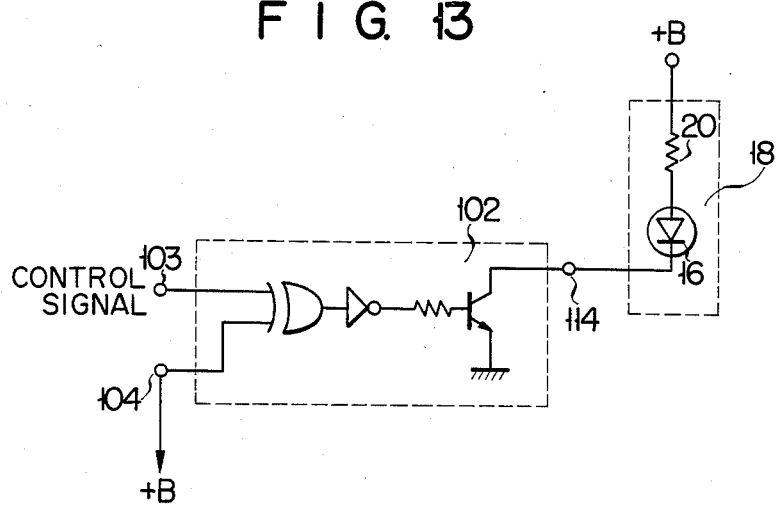
FIG. 13 shows how the drive circuit of FIG. 12 drives an LED display device.
Figure 14:
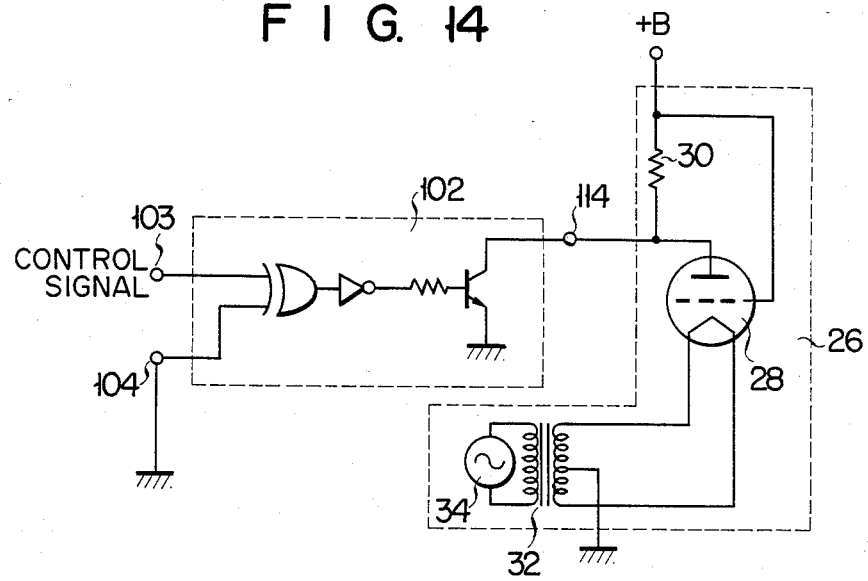
FIG. 14 illustrates how the drive circuit of FIG. 12 drives an FL display device.
Figure 15:
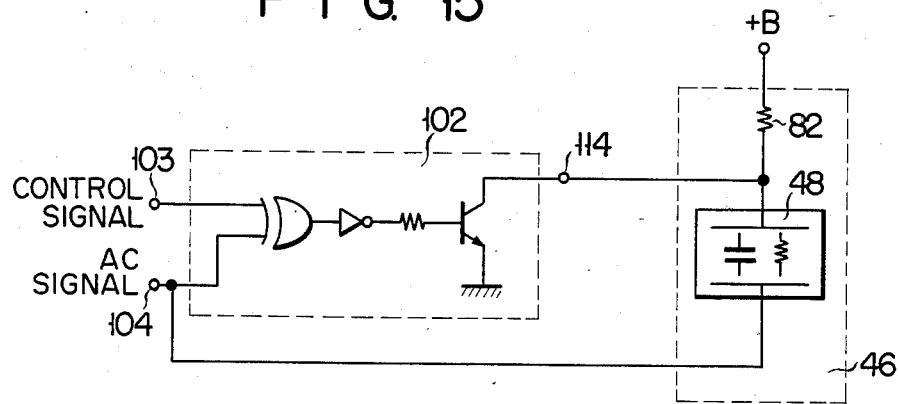
FIG. 15 shows how the drive circuit of FIG. 12 drives an LCD display device.

FIGS. 13, 14 and 15 illustrate how the drive circuit 102 of FIG. 12 drives an LED display device, an FL display device and an LCD display device which are identical in structure respectively with those shown in FIGS. 5, 6 and 7. The drive circuit 102 operates in the same way as does the drive circuit 62 as described with reference to FIGS. 5, 6 and 7.

Figure 16:
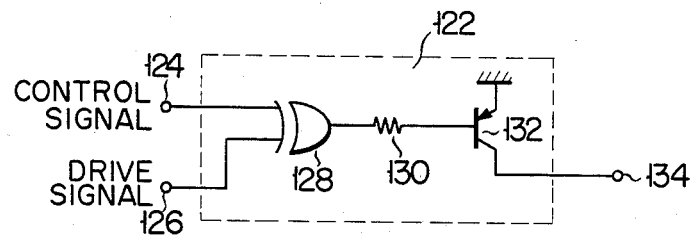
FIG. 16 is a circuit diagram of a further drive circuit embodying the invention.

Moreover, according to this invention, the MOS transistor used in the embodiments of FIGS. 4 and 8 may be replaced by a bipolar transistor, for example a PNP transistor as shown in FIG. 16. A drive circuit 122 shown in FIG. 16 comprises an exclusive OR gate 128 having a control terminal 124 and a drive terminal 126, a resistor 130 connected to the output of the OR gate 128 and a PNP transistor 132 having its gate connected to the resistor 130. The collector of the PNP transistor 132 is used as the output terminal 134 of the drive circuit 122. When a control signal and a drive signal, both being of a high level or a low level, are applied respectively to the control terminal 124 and the drive terminal 126, the PNP transistor 132 is turned on, whereby the output terminal 134 is placed at a low level. The drive circuit 122 corresponds to the drive circuit 92 of FIG. 8 as far as the level of voltage applied is concerned.

Figure 17:
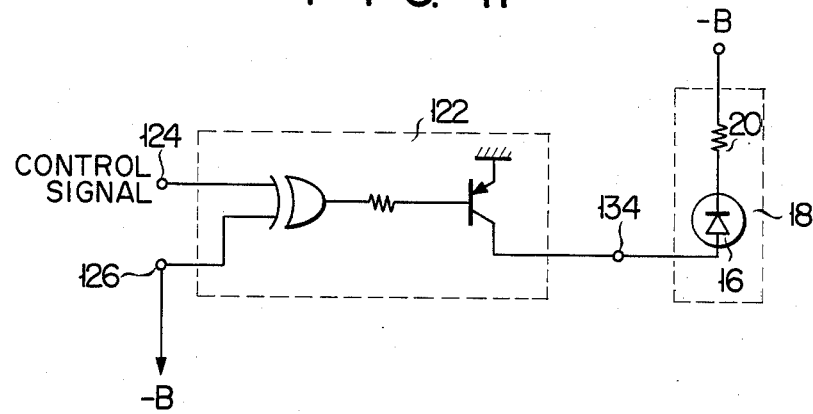
FIG. 17 illustrates how the drive circuit of FIG. 16 drives an LED display device.

FIGS. 17, 18 and 19 illustrate how the drive circuit 122 of FIG. 16 drives an LED display device, an FL display device and an LCD display device which are identical in structure respectively with those shown in FIGS. 9, 10 and 11. The drive circuit 122 operates in the same way as does the drive circuit 92 of FIG. 8 as described with reference to FIGS. 9, 10 and 11.

Figure 20:
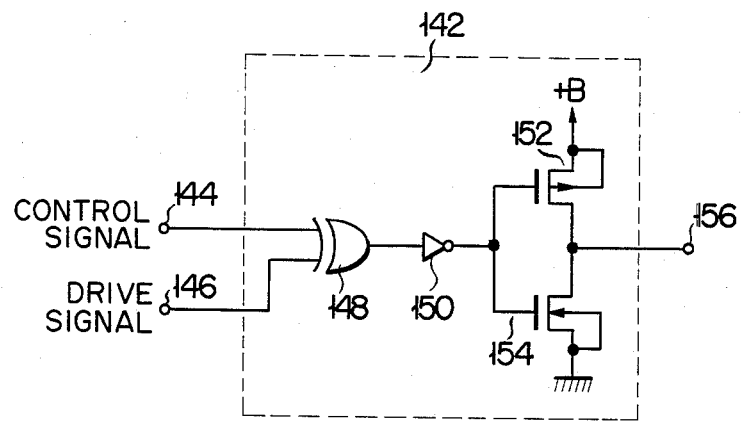
FIG. 20 is a circuit diagram of still another drive circuit embodying this invention.

Still further, according to this invention, the MOS transistor used in the embodiments of FIGS. 4 and 8 may be replaced by complementary MOS (C-MOS) transistors, as illustrated in FIG. 20. A drive circuit 142 shown in FIG. 20 comprises an exclusive OR gate 148 having a control terminal 144 and a drive terminal 146, an inverter 150 connected to the output of the OR gate 148, a P channel MOS transistor 152 and an N channel MOS transistor 154. The MOS transistors 152 and 154 have their gates connected to the output of the inverter 150 and are connected in series to each other. The drain of the MOS transistor 152 is connected to the drain of the MOS transistor 154. The junction of the drains is used as the output terminal 156 of the drive circuit 142. The sources of the MOS transistors 152 and 154 are connected to their substrates, respectively. The P channel MOS transistor 152 functions as a resistor, and the N channel MOS transistor 154 as a switching element. When a control signal and a drive signal, both having a high level or a low level, the output terminal 156 delivers a signal of low level. On the other hand, when either a control signal or a drive signal supplied has a low level, the output terminal 156 delivers a signal of high level.

Figure 21:
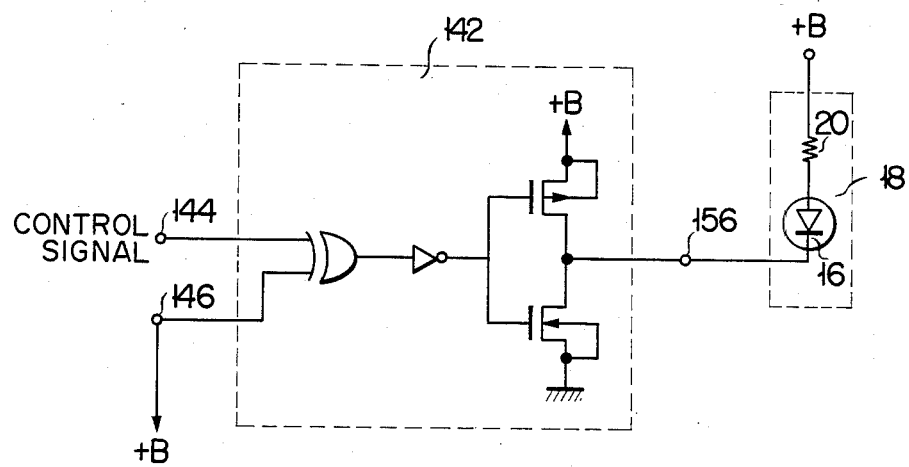
FIG. 21 shows how the drive circuit of FIG. 20 drives an LED display device.
Figure 22:
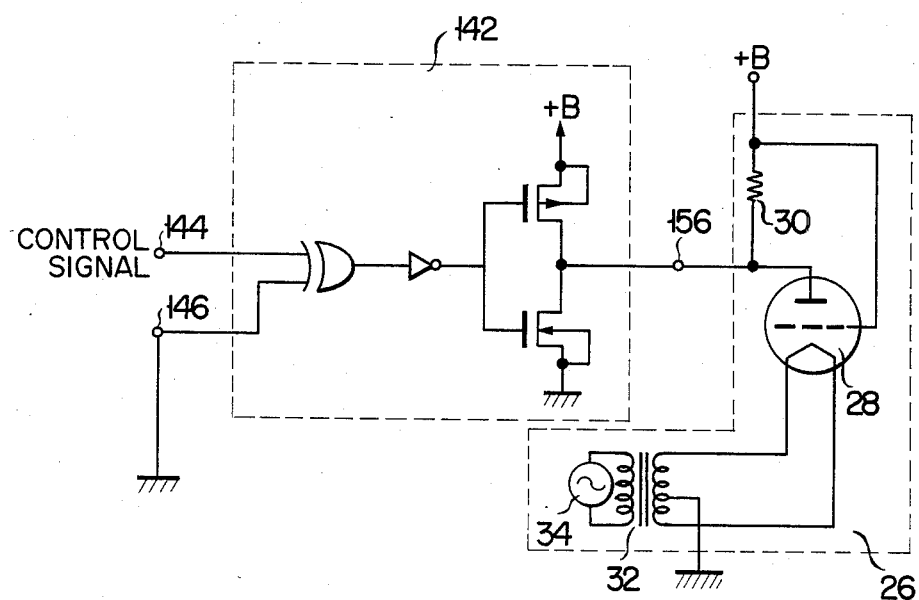
FIG. 22 illustrates how the drive circuit of FIG. 20 drives an FL display device.
Figure 23:
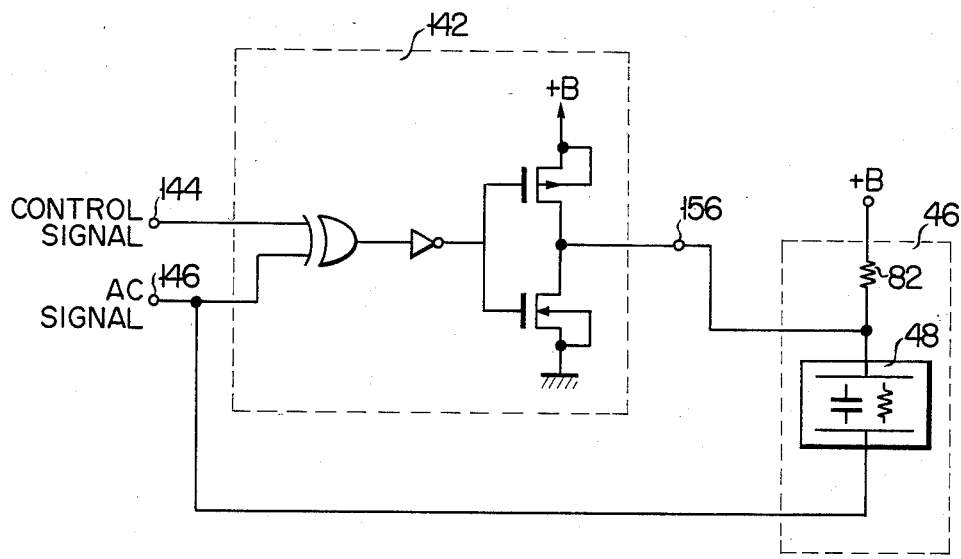
FIG. 23 illustrates how the drive circuit of FIG. 20 drives an LCD display device.

FIGS. 21, 22 and 23 illustrate how the drive circuit 142 of FIG. 20 drives an LED display device, an FL display device and an LCD display device which are identical in structure respectively with those shown in FIGS. 5, 6 and 7. The drive circuit 142 operates in the same manner as does the drive circuit 62 as described with reference to FIGS. 5, 6 and 7.

Any drive circuit embodying this invention may be used to drive a display device each display element of which consists of seven display segments. Further, any drive circuit according to this invention can be used as a dynamic type drive circuit.

What is claimed is:

1. A drive circuit for driving an LED display device comprising:
   a first input terminal for receiving a high level voltage drive signal;
   a second input for receiving a pulsing control signal;
   a logic gate for providing an EXCLUSIVE OR of said drive signal and control signal; and
   a switching transistor element connected between said display device and a reference potential, said transistor element being turned on according to the output of said logic gate.

2. A drive circuit for driving a fluorescent display device comprising:
   a first input terminal for receiving a low level voltage drive signal;
   a second input terminal for receiving a pulsing control signal;
   a logic gate providing an EXCLUSIVE OR of said drive and control signals; and
   a switching transistor element connected between said display device and a reference potential, said switching transistor being turned on according to the output level of said logic gate.

3. A drive circuit for driving an LCD display device comprising:
   a first input terminal for receiving an AC voltage drive signal;
   a second input terminal for receiving a pulsing control signal;
   a first output terminal providing said AC voltage drive signal to one end of said LCD display device;
   a logic gate providing an EXCLUSIVE OR of said drive and control signals; and
   a switching transistor element being turned on according to the output level of said logic gate, said switching transistor element being connected between a reference potential and a second output terminal connected to the other end of said LCD display device.

4. A method for operating a drive circuit for an LED display device, comprising the steps of:
   supplying, as a drive signal to a drive terminal of said circuit, a high level signal;
   supplying, as a control signal to a control terminal of said drive circuit, a pulsing control signal;
   providing an EXCLUSIVE OR of said drive and control signals; and
   driving said LED display device according to the results of said EXCLUSIVE OR operation.

5. A method for operating a drive circuit for a fluorescent display device comprising the steps of:
   supplying, as a drive signal to a drive terminal of said circuit, a low level signal;
   supplying, as a control signal to a control terminal of said drive circuit, a pulsing control signal;
   providing an EXCLUSIVE OR of said drive and said control signals; and
   driving said fluorescent display device according to the results of said EXCLUSIVE OR operation.

6. A method for operating a drive circuit for an LCD display device comprising the steps of:
   supplying, as a drive signal to a drive terminal of said circuit, an AC voltage signal;
   supplying, to a first side of said display device, said AC voltage signal;
   supplying, as a control signal to a control terminal of said drive circuit, a pulsing control signal;
   providing an EXCLUSIVE OR of said drive and control signals; and
   driving said display device by providing to a second side of said display device a signal representing the results of said EXCLUSIVE OR operation.

7. A drive circuit according to any one of claims 1-3, wherein said switching transistor element is an MOS transistor.

8. A drive circuit according to claim 7, wherein said MOS transistor is an N channel type MOS transistor, and an inverter is connected between the gate of the MOS transistor and said logic gate.

9. A drive circuit according to claim 7, wherein said MOS transistor is a P channel type MOS transistor.

10. A drive circuit according to any one of claims 1-3, wherein said switching transistor element is a bipolar transistor.

11. A drive circuit according to claim 10, wherein said bipolar transistor is an NPN type transistor, and an inverter is connected between the gate of the NPN type transistor and said logic gate.

12. A drive circuit according to claim 10, wherein said bipolar transistor is a PNP type transistor.

13. A drive circuit according to any one of claims 1-3, wherein said switching transistor element consists of complementary MOS transistors.

14. A drive circuit according to claim 13, wherein said MOS transistors are a P channel MOS transistor functioning as a load resistor and an N channel MOS transistor functioning as a switching transistor.

15. A drive circuit according to claim 1, which produces a signal of low level when said first input terminal and said second input terminal receive respectively a drive signal and a control signal both of which have a high level.

16. A drive circuit according to claim 2, which produces a signal of high level when at least one of said input terminals receives a signal of a low level.

17. The method of any one of claims 4-6 wherein said driving step includes the step of controlling an MOS transistor with the result of said EXCLUSIVE OR operation.

18. The method in claim 17 wherein said step of controlling an MOS transistor includes the step of inverting the result of said EXCLUSIVE OR operation and controlling an N-channel MOS transistor.

19. The method in claim 17 wherein the step of controlling an MOS transistor includes the step of controlling a P-channel MOS transistor.

20. The method in any one of claims 4-6 wherein said driving step includes the step of controlling a bipolar transistor with the result of said EXCLUSIVE OR operation.

21. The method of claim 20 wherein the step of controlling the bipolar transistor includes the step of inverting the result of said EXCLUSIVE OR operation and driving an NPN type transistor with said inverted result.

22. The method in claim 20 wherein the step of controlling a bipolar transistor includes the step of controlling a PNP type transistor.

23. The method in any one of claims 4-6 wherein said driving step includes the step of controlling complementary MOS transistors according to the results of said EXCLUSIVE OR operation.

24. The method in claim 23 wherein the step of controlling complementary MOS transistors includes the step of using a P channel MOS transistor as a load resistor and an N channel MOS transistor as a switch transistor.

* * * * *